United States Patent
Bahns et al.

[11] Patent Number: 6,020,747
[45] Date of Patent: Feb. 1, 2000

[54] ELECTRICAL CONTACT PROBE

[76] Inventors: John T. Bahns, 157 Separatist Rd., Storrs, Conn. 06268; Eli K. Dabora, 159 Davis Rd., Mansfield, Conn. 06450

[21] Appl. No.: 09/013,083

[22] Filed: Jan. 26, 1998

[51] Int. Cl.[7] .................................................. G01R 1/067
[52] U.S. Cl. ............................................ 324/754; 324/761
[58] Field of Search .................................. 324/754, 761, 324/158.1, 762, 757, 758; 204/400, 403

[56] References Cited

U.S. PATENT DOCUMENTS

| | | | |
|---|---|---|---|
| 3,915,850 | 10/1975 | Crownover | 324/759 X |
| 4,090,984 | 5/1978 | Lin et al. | 252/511 |
| 4,306,169 | 12/1981 | Diepers | 310/248 |
| 4,943,720 | 7/1990 | Jones | 324/754 X |
| 4,959,130 | 9/1990 | Josowicz et al. | 204/32.1 |
| 5,134,364 | 7/1992 | Karpman et al. | 324/158 |
| 5,218,757 | 6/1993 | Kaneko et al. | 29/855 |
| 5,273,639 | 12/1993 | Kaneko et al. | 204/400 |
| 5,302,904 | 4/1994 | Nopper | 324/536 |
| 5,380,422 | 1/1995 | Negishi et al. | 204/403 |
| 5,433,906 | 7/1995 | Dasch et al. | 264/117 |
| 5,532,613 | 7/1996 | Nagasawa et al. | 324/761 |
| 5,587,664 | 12/1996 | Banitt et al. | 324/752 |
| 5,596,283 | 1/1997 | Mellitz et al. | 324/754 |
| 5,704,118 | 1/1998 | Kaneko et al. | 29/874 |

OTHER PUBLICATIONS

Ebbesen et al. "Electrical conductivity of individual carbon nanotubes", Nature 382, p. 54, (No Month) 1996.

Hsu et al. "Electrolytic formation of carbon nanotubes", Chem. Phys. Lett. 262, 161–166 (No Month) (1996).

Loiseau et al. "Synthesis of long carbon nanotubes filled with Se, S, Sb and Ge by the arc method", appearing in Chem Phys. Lett. 256 246–252 (No Month) (1996).

*Primary Examiner*—Josie Ballato
*Assistant Examiner*—T. R. Sundaram
*Attorney, Agent, or Firm*—Todd E. Garabedian; Gregory S. Rosenblatt; Wiggin & Dana

[57] ABSTRACT

The present invention is directed to an electrical contact probe, comprising at least one fiber mounted in a holder, the at least one fiber having high electrical conductivity and high mechanical strength and made from a material selected from the group consisting of a conductive organic material and a conductive glass, the at least one fiber having a diameter in the range from 5 nanometers to 20 micrometers. The present invention is also directed to a device to measure various electrical parameters of a circuit.

32 Claims, 4 Drawing Sheets

ELECTRICAL CONTACT PROBE

BACKGROUND OF THE INVENTION

1. Field of the Invention

The invention relates to contact probes for use in testing electrical circuits, particularly electrical circuits on printed circuit boards or printed wire boards. More particularly, the invention relates to an electrical contact probe comprising a holder holding one or more fibers having low electrical resistance and high mechanical strength for use in testing electrical circuits. The invention also relates to an electrical test device that uses the contact probe.

2. Description of the Related Art

The integrity of semiconductor device elements such as printed circuit boards and printed wire boards are generally evaluated shortly after manufacturing in order to identify and eliminate various faults such as short circuits or open circuits. Quality testing of this kind reduces the number of defective elements and leads to the highly reliable and maintenance-free electrical devices that are used today.

Two general types of tests are currently used to evaluate the electrical connections in newly manufactured semiconductor elements. In one type of test, the element is mounted on a mounting stand and measurement pads are brought into electrical contact with a card having probe pins arranged in a one- or two-dimensional array specific for the particular semiconductor element being tested. An electrical signal is sent through the card and monitored for open or short circuits. Elements that pass these tests are packaged and incorporated into other devices. Defective elements are either repaired or discarded.

However, this test approach suffers several disadvantages. First, the array of pins necessary to test the circuit are specific to a single circuit pattern. Accordingly, these test cards are time-consuming and expensive to produce and have limited usefulness. Also, as the circuit spacing in integrated electrical circuits is reduced, this method of testing becomes increasingly difficult to implement successfully due to spacing limitations between the pins. A lower circuit spacing limit for this testing approach is approximately 0.025 inches. Circuits having circuit spacings below this limit are generally not amenable to this type of testing procedure.

A second testing approach utilizes one or more moveable, stiff, needle-like probes, typically made from a conductive metal such as copper, tungsten or titanium. A typical test cycle using this approach includes (1) raising the probe from the surface of the element being tested, (2) moving the probe to a position over the next circuit to be tested, and (3) lowering the probe to make electrical contact with the circuit.

This approach also suffers several disadvantages. First, this method of testing circuits requires stiff probes that must slow down and stop above selected contact test pads before being moved downward until contact is made for each continuity determination. This sequence of moves, starts, and stops must be repeated for every continuity determination (which can be many thousands of times for each circuit board). This tedious procedure results in the probes spending a significant percentage of the total testing time executing moves, starts and stops. In addition, the probe must be moved in three dimensions, thus requiring a highly complex moving apparatus. Also, in order for the testing to take place, the stiff probe must come into contact with the circuit pads (test points). Frequently, significant mechanical force is required to establish contact between the probe and the circuit pad, and can lead to damage of the circuit pad or the probe if the degree of applied force is not monitored carefully.

The following U.S. Patents represent the general state of the art:

U.S. Pat. No. 5,218,757 issued to Kaneko et al. a method of making tapered carbon microelectrodes for use in various electrochemical measurements and scanning tunneling microscopes. However, the disclosed microelectrode made from the process is coated with an insulative material and is not used for testing electrical circuitry.

U.S. Pat. No. 5,532,613 to Nagasawa et al. discloses an electrical probe needle that is coated with a conductive film and shielded with an insulating film. The insulation applied to each probe needle alleviates noise and mutual crosstalk between signal currents. Additionally, the insulative layer applied to each probe needle prevents short-circuiting if the needles touch each other.

U.S. Pat. No. 5,596,283 to Mellitz et al. discloses an electrical test method and apparatus that includes a probe having a rolling ball at the tip. However, tips of this type are generally made from conductive metals and not organic (e.g., carbon) materials.

Thus, the current state of the art methods for testing electrical circuits requires stiff, nonfiber probes that must slow down and stop above selected pads before being moved downward until contact is made for each continuity determination. In addition, current testing procedures require that the probe and contact pad are subjected to significant mechanical force which can result in surface damage. What is needed in the art is a precision probe with a high spatial resolution that can be operated at relatively high speed without physically affecting the circuit test pads. The present invention is believed to be an answer to that need.

BRIEF SUMMARY OF THE INVENTION

In one aspect, the present invention is directed to an electrical contact probe, comprising at least one fiber mounted in a holder, the at least one fiber having high electrical conductivity and high mechanical strength and made from a material selected from the group consisting of a conductive organic material and a conductive glass, the at least one fiber having a diameter in the range from 5 nanometers to 20 micrometers.

In another aspect, the present invention is directed to an electrical circuit test device, comprising a contact probe comprising at least one fiber mounted in a holder, the at least one fiber having high electrical conductivity and high mechanical strength and made from a material selected from the group consisting of a conductive organic material and a conductive glass, the fiber having a diameter in the range from about 5 nanometers to about 20 micrometers; a current source in electrical communication with the contact probe; and a measuring device in electrical communication with the contact probe.

In another aspect, the present invention is directed to an electrical circuit test device, comprising a first contact probe comprising at least one first fiber mounted in a first holder, the at least one first fiber having high electrical conductivity and high mechanical strength and made from a material selected from the group consisting of a conductive organic material and a conductive glass, the fiber having a diameter in the range from about 5 nanometers to about 20 micrometers; a second contact probe comprising at least one second fiber mounted in a second holder, the at least one second fiber having high electrical conductivity and high mechanical strength and made from a material selected from the group consisting of a conductive organic material and a conductive glass, the fiber having a diameter in the range from about 5 nanometers to about 20 micrometers; a current source in electrical communication with the first contact probe and the second contact probe; and a measuring device in electrical communication with the current source.

These and other aspects will become apparent upon reading the following detailed description of the invention.

BRIEF DESCRIPTION OF THE DRAWINGS

The invention will be more fully understood from the following detailed description taken in conjunction with the accompanying drawings in which.

DETAILED DESCRIPTION OF THE INVENTION

Figure 1:
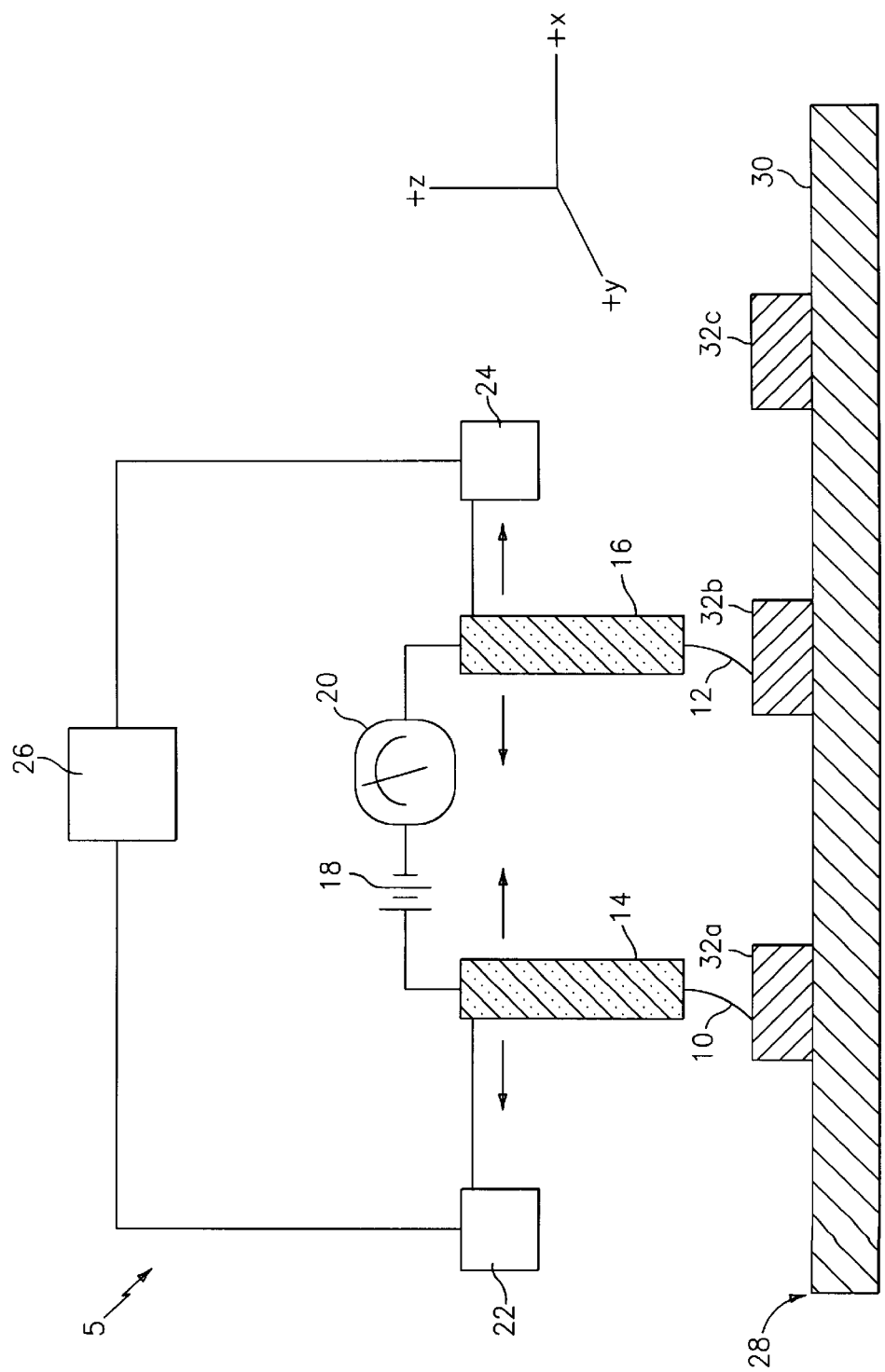
FIG. 1 is a schematic view of an electrical testing apparatus utilizing the continuous motion electrical contact probe of the invention.

As described above, the invention is an electrical contact probe comprising at least one fiber mounted in a holder and used in testing the continuity or other parameter of electrical circuits such as printed circuits, printed wire boards, and the like.

Suitable materials that are useful for the fiber of the electrical contact probe of the invention are those materials that provide both low electrical resistance and high mechanical strength when formed into fibers or filaments. Examples of materials having both high electrical conductivity and high mechanical strength include carbon fibers, carbon nanotubes, conductive glasses such as "METGLAS" (amorphous metal alloy available from Allied Signal Corp., Parsippany, N.J.), and conductive polymers such as polyacetylene, polyphenylene, polypyrrole, polyquinoline, or polypyridine (available from Monsanto Corp., Worcester, Mass.). Preferably, the fiber takes the form of carbon nanotubes or carbon fibers. Carbon fibers may optionally be coated with a metal such as nickel to enhance conduction and durability of the fiber.

Carbon nanotubes belong to a small family of carbon compounds known as fullerenes. These tube-like structures may have single walls or multiple walls, with each nanotube wall being essentially one carbon atom thick.

Carbon nanotubes may be made by any method known in the art, such as laser ablation (Kroto, H. W., Heath, J. R., O'Brien, S. C., Curl, R. F., and Smalley, R. E., Nature 318, 162 (1985)); Kratschmer/Huffman method (Kratschmer, W., Lamb, L. D., Fostiropoulos, K., Huffman, D., Nature 347, 354, (1990)); hydrocarbon pyrolysis (M. Endo, Chemtech, September, 1988, p. 568)); and electrolysis (Hsu et al., Chem. Phys. Lett. 262, 161–166 (1996)). For example, carbon nanotubes may be generated by electrolysis in molten alkali halide salts using carbon electrodes under an argon atmosphere as described by Hsu et al., Chem. Phys. Lett. 262, 161–166 (1996). Briefly, this method utilizes a graphite anodic crucible and a carbon rod cathode set inside a quartz glass tube. The crucible is filled with ionic salts such as LiCl and the entire device is placed in an argon atmosphere. The device is heated and electrified for a specified amount of time, and carbon nanotubes are isolated from the salt by solvent extraction. Carbon nanotubes are also commercially available from various sources (Bucky USA, Houston, Tex.; Hyperion, Inc., Boston, Mass.; Alfa, Inc., Ward Hill, Mass.; Aldrich Chemical Co., Milwaukee, Wis.).

Typically, carbon fibers are produced by pyrolysis of polymer fibers such as polyacrylonitrile, rayon, or "ORLON" (copolymer containing at least 85% acrylonitrile). Commercial processing produces long yarns composed of 3,000–12,000 individual carbon fiber filaments. Carbon fibers are commercially available from many sources (e.g., Composite Materials, Inc., Mamaroneck, N.Y.; American Cyanamid Co., Wallingford, Conn.). Carbon fibers coated with a conductive metal such as nickel, copper, gold, aluminum, and the like, may also be used to increase electrical conduction. Alternatively, the fibers may be coated with an insulative layer, such as nylon, acrylic, styrene, or polyvinylchloride. Preferably, the thickness of the metal or insulative coating is about 0.5 micrometers. These carbon fibers generally require no additional modification for use as probes in the present invention. Furthermore, because continuous single fibers of unlimited length are available, fiber tips can be replaced or renewed by routine trimming.

Suitable fiber diameters generally depend on the source of the fiber. For carbon nanotubes, preferable diameters range from about 5 to about 2,000 nanometers, more preferably from about 6 to about 15 nanometers, and most preferably from about 8 to about 12 nanometers. A particularly useful diameter for carbon nanotubes is about 10 nanometers. For carbon fibers, preferable diameters range from about 2 to about 20 micrometers, more preferably from about 5 to about 10 micrometers, and most preferably from about 6 to about 8 micrometers. A particularly useful diameter for carbon fibers is about 7 micrometers.

The small diameters of the fiber allows single leads on the densely packed modern circuits made today to be easily contacted and tested. The small diameter of the fiber also allows for very high spatial resolution of the probe (generally the diameter of the fiber). In other words, a fiber with a very small diameter can test leads that are the same size or larger than the diameter of the fiber. By contrast, fibers with larger diameters are not capable of testing densely packed leads because the diameter of the fiber will likely make contact with more than one lead. For example, current microelectronic circuitry utilizing electrical leads that are 75–125 micrometers in width with a pitch (i.e., center-to-center spacing) of from 150–250 micrometers may be easily tested using the electrical contact probe of the invention since the diameter of the fibers are much smaller than the width of the leads or the pitch between them.

Useful lengths of the fiber generally vary depending on the chosen material. Lengths of useful carbon nanotube materials preferably range from about 5 to about 10,000 micrometers, more preferably from about 10 to about 500 micrometers, and most preferably from about 50 to about 100 micrometers. On the other hand, carbon fibers, coated carbon fibers, and conductive polymers and glasses are commercially available in virtually any length. Preferably, the length (L) of the fiber is greater than height of anticipated surface imperfections on the circuit so that the electrical contact probe fiber can slide on the circuit surface from contact pad to contact pad continuously without becoming disconnected from the circuit surface as described in more detail below.

The range of useful lengths and diameters of the fiber results in a large aspect ratio for the fiber (i.e., the ratio of length to diameter of the fiber (L:D)). For example, high tensile strength carbon nanotubes typically have aspect ratios on the order of $10^4$ (ratio of 0.1 mm length to 0.00001 mm diameter).

Useful aspect ratios for the fiber utilized in the electrical contact probe of the invention preferably range from about 100 to about $10^8$, and more preferably from about $10^3$ to about $10^4$.

According to the invention, the fiber utilized in the electrical contact probe possesses low electrical resistance at room temperature. As used herein, the term "low electrical resistance" refers to resistivities in the range of from about $10^{-3}$ to about $10^5$ Ohm.meters, more preferably in the range of from about 0.1 to about 30 Ohm.meters; and most preferably in the range of from about 1 to about 3 Ohm.meters. For example, a typical carbon nanotube composed of a bundle of five or more tubes has an electrical resistance of about $3 \times 10^4$ Ohms. A nickel-coated carbon fiber 1 inch in length, in contrast, has electrical resistance of approximately 35 Ohms. Thus, metal coated carbon fibers provide the advantage of lower resistance than carbon nanotubes, while carbon nanotubes provide the advantage of smaller diameter and easier testing of tightly packed circuitry.

According to the invention, the fiber portion of the electrical contact probe also possesses and high mechanical strength at room temperature. High mechanical strength and elasticity are important properties for the formation of a sliding contact probe used in an electrical testing apparatus. As used herein, the term "high mechanical strength" refers to a combination of material properties such as high tensile strength (rupture strength per unit area of a material subjected to a specified dynamic load), high modulus of elasticity (also termed flexural modulus and expressed as the ratio of stress to strain as a material is deformed under dynamic load), and high tenacity (strength per unit weight of a fiber or filament). Useful values of tensile strength for the fibers of the present invention preferably range from about $3 \times 10^4$ to about $1.3 \times 10^8$ PSI, and more preferably from about $1 \times 10^6$ to about $1.3 \times 10^6$ PSI. Useful values of modulus of elasticity for the fibers of the present invention range from about $3 \times 10^4$ to about $10^8$ PSI, and more preferably from about $10^6$ to about $10^7$ PSI. Nickel-coated carbon fibers for example, have tensile strengths of about $450 \times 10^3$ PSI (3100 MPa) and modulus of elasticity of about $32 \times 10^6$ PSI (220 GPa).

The holder utilized to hold the fiber portion of the electrical contact probe may be any holder that is capable of holding fibers having the aforementioned dimensions. In one embodiment, the holder consists of a glass tube packed with an electrically conductive powder such as graphite. The conductive packing serves as a medium for establishing electrical contact to the fiber. Alternatively, the fiber may be directly attached (e.g., soldered) to the holder for a permanent connection.

While the electrical contact probe described above is a single fiber, more than one fiber can be used according to the method of the invention. For example, an electrical contact probe can be designed that consists of several fibers aligned in a linear bundle so as to form a ribbon-like tip. Preferably, the width of the ribbon spans the width of the lands in the circuit so that the contact area is increased. This increase in contact area decreases the overall resistance of the probe.

FIG. 1 is a diagram of an electrical testing apparatus 5 utilizing the continuous motion electrical contact probe of the invention. As shown in FIG. 1, the testing apparatus 5 includes two fibers 10 and 12 held in respective holders 14 and 16. The fibers 10 and 12 are preferably made from the materials listed above (e.g., carbon nanotubes, carbon fibers, metal-coated carbon fibers, etc.). The two holders 14 and 16 are each connected in series to a common voltage source 18 and a measuring device, such as a current meter 20. The holders 14 and 16 are connected to respective motors 22 and 24, and the motors 22 and 24 are connected to a computer 26, or other controlling device. Exemplary controlling devices are disclosed in U.S. patent application Ser. No. 08/538,929, now U.S. Pat. No. 5,735,173 entitled MULTI-DRIVE POSITION CONTROL SYSTEM filed Oct. 4, 1995 by Ronald W. Parker, and U.S. patent application Ser. No. 08/859,145, now U.S. Pat. No. 5,732,592, entitled PIVOTALLY-LINKED POSITION CONTROL DRIVE SYSTEM filed May 20, 1997 by Ronald W. Parker, each of which is incorporated by reference in its entirety herein. The motors 22 and 24 move the holders 14 and 16 independently in any direction with respect to the XYZ coordinates. The circuit to be measured 28 generally consists of a nonconducting substrate 30 typically made from glass filled epoxy or polyimide, and includes conductive test pads 32a, 32b, and 32c printed onto the nonconducting substrate 30. As shown in FIG. 1, fibers 10 and 12 are in physical contact with a pair of test pads 32a and 32b. The holders 14 and 16 are positioned above selected test pads 32a and 32b so that the fibers 10 and 12 must bend in order to contact the pads. This bending of the fibers creates a force (known in the art as the Euler buckling force) that assures good electrical connection between the pad and the fibers. However, this force is not so large as to cause damage to the fibers or the test pads.

Testing the circuit 28 with the testing apparatus 5 is accomplished by instructing the computer 26 to engage the motors 22 and 24 and move the holders 14 and 16 in the X-Y plane (preferably at a fixed value of Z). As the motors 22 and 24 move the holders 14 and 16, the respective fibers 10 and 12 are slid over the surface of the circuit 28 such that new contacts are established at different test pads 32a, 32b, 32c (more easily seen in FIG. 2).

Assessing whether two pads (e.g., 32a and 32b) are electrically connected is accomplished by directing the motors 22 and 24 to move the holders 14 and/or 16 in the XY plane so that the fibers 10 and 12 come into contact with the desired pads. Once the fibers 10 and 12 are in electrical contact with the desired pads, the continuity of the circuit is indicated by flow of current from the current source 18 through the fibers 10 and 12, and is measured by the current meter 20. Thus, if current flows through the current meter 20, it can be concluded that pads 32a and 32b are electrically connected and therefore are part of the same electrical circuit (continuity confirmed). On the other hand, if no current flows through the fibers 10 and 12, (e.g. no signal of current meter 20), it can be concluded that the pads 32a and 32b are not electrically connected and are therefore not part of the same electrical circuit (no continuity). Testing of the circuit 28 continues as the holders slide the fibers 10 and 12 in the XY plane to another selected pair of contact pads (e.g., 32b and 32c) while noting the presence or absence of current flow in the current meter 20.

Figure 2:
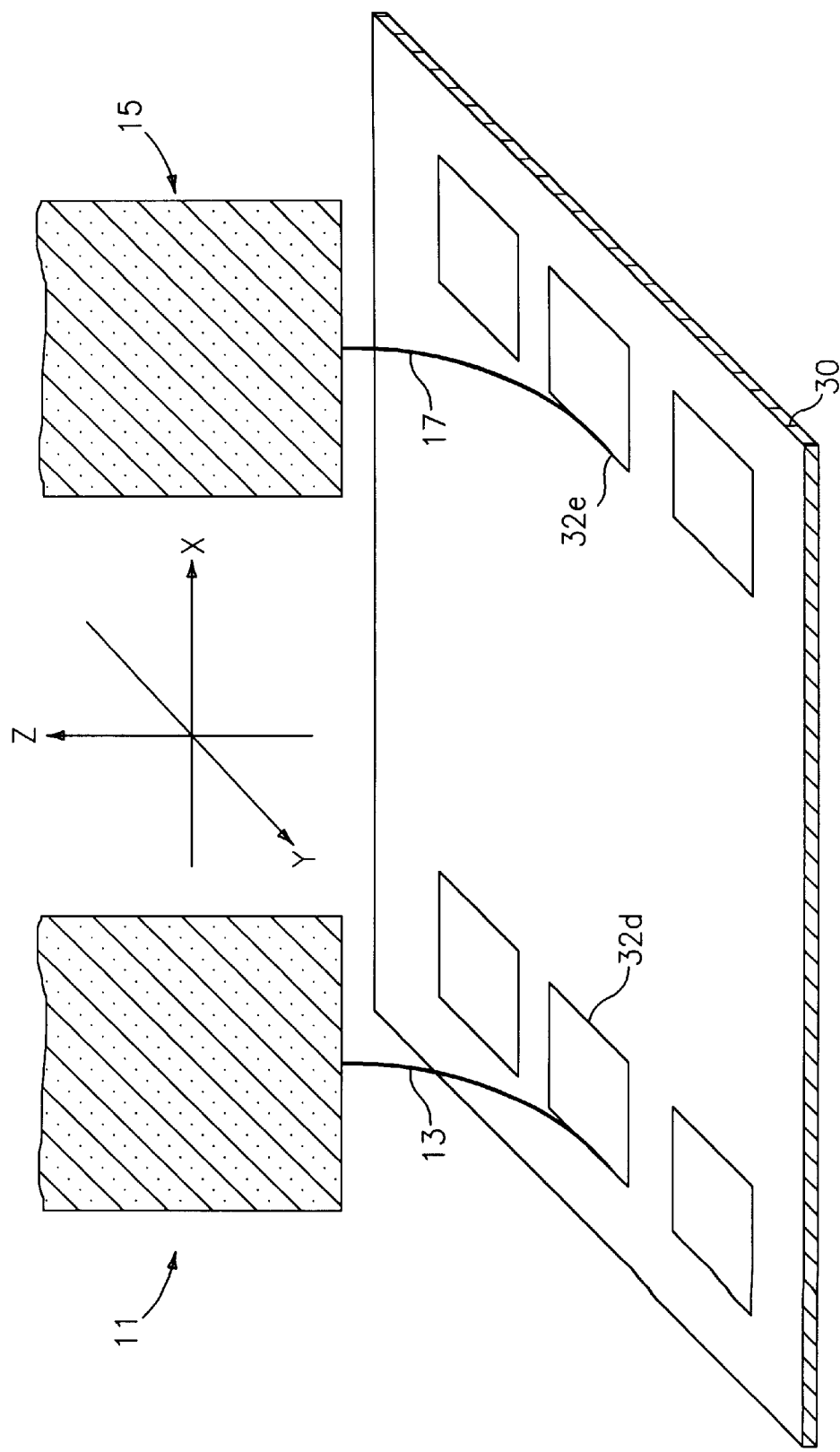
FIG. 2 is a perspective view of a pair of contact probes that are moveable in the XY plane according to the invention.

FIG. 2 shows a perspective view of a pair of contact probes 11 and 15 having fibers 13 and 17 in contact with pads 32d and 32e. As described above, during testing, the contact probes 11 and 15 can be moved continuously in the XY plane so that the fibers 13 and 17 come into contact with any of the other test pads on the substrate 30.

In order to enhance the contact between the electrical contact probe and the test pad, an optional air jet may be incorporated into the bottom of the fiber holder to provide a flow of air that pushes the tip of the fiber against the surface being tested. The additional pressure applied to the fiber can enhance contact between the fiber and the tested circuit.

Because electrical evaluation measurements can be made continuously as the fibers are slid from contact pad to contact pad, there is no need for the fibers 10 and 12 to slow down or come to a stop in the X-Y plane during the testing procedure. In addition, there is no need for the fibers 10 and 12 to be moved in the Z (vertical) direction during measurements. Rather, the fibers make contact continuously with a wide variety of surfaces by dragging them over the surface because they are capable of bending upon encounters with surface imperfections (e.g. pads or electrical leads) and returning to their original shape when no surface imperfection is encountered. The fiber portion of the electrical contact probe of the invention eliminates the need for starts and stops in the X-Y plane and motion in the Z direction, thereby reducing circuit testing time (estimated reductions are about 40%). In addition, fiber portion of the electrical contact probe of the present invention are less damaging to delicate circuit contacts because significantly less force is exerted at the contact point between the pad and the fiber.

Figure 3:
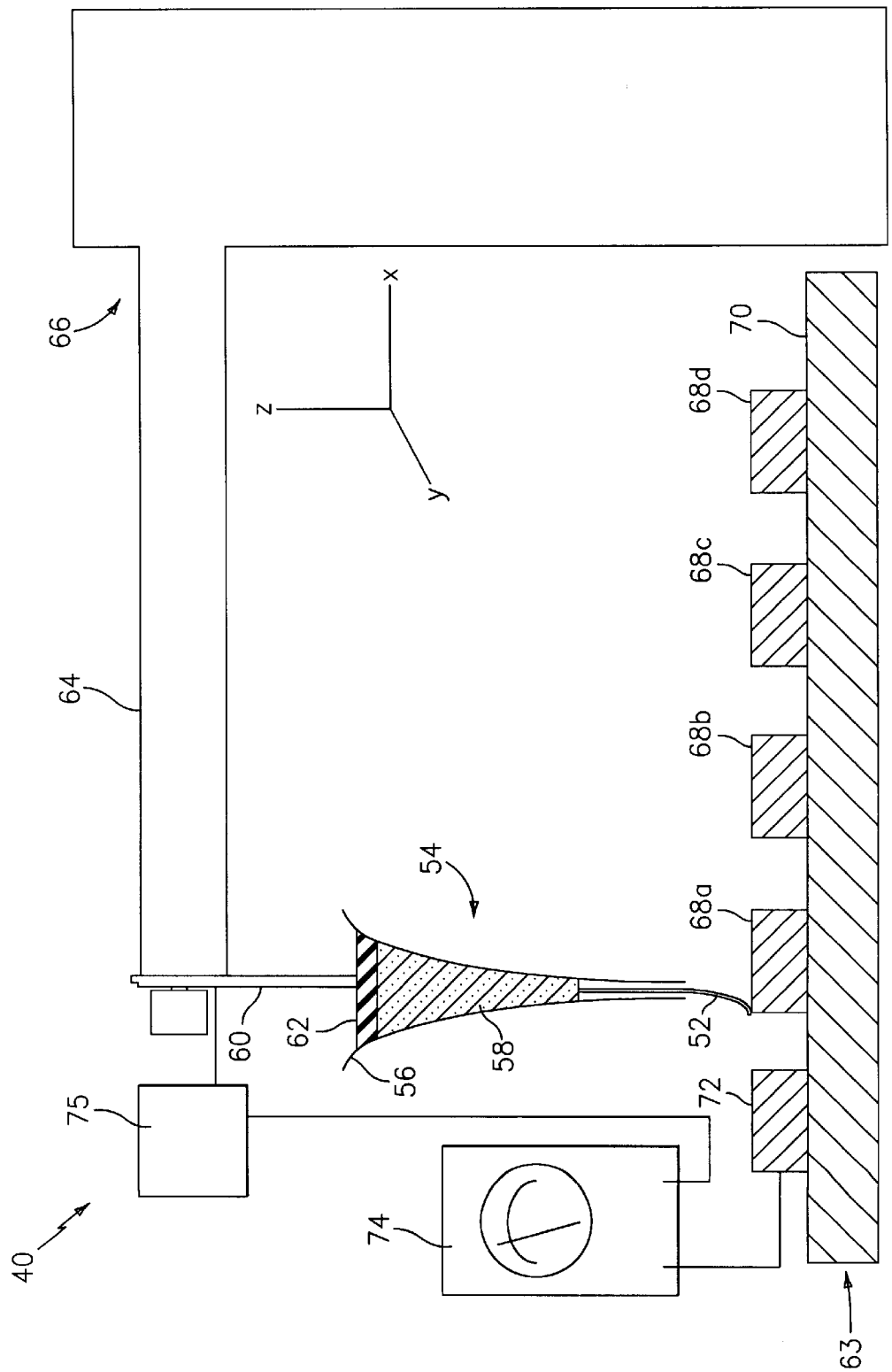
FIG. 3 is a schematic view of another embodiment of an electrical testing apparatus utilizing the continuous motion electrical contact probe of the invention.

FIG. 3 is a schematic view of another embodiment of an electrical testing apparatus utilizing the continuous motion electrical contact probe of the invention. As shown in FIG. 3, the apparatus 40 includes a fiber 52 mounted in a holder 54. The fiber 52 is made from the materials outlined above (e.g., carbon nanotubes, carbon fibers, conductive glasses, or conductive polymers). In this embodiment, the fiber is preferably a nickel-coated carbon fiber (about 60% nickel by weight; 7 $\mu$m in diameter and several inches in length, with a coating thickness of about 0.5 $\mu$m). The fiber 52 is supported by a holder 54 consisting of a graduated glass tube 56 packed with an electrically conductive powder 58. Useful electrically conductive powders include graphite powder (25–100 mesh size), copper, aluminum, silver paste, or combinations thereof. The conductive packing 58 serves as a medium for establishing electrical contact between the fiber 52 and a copper support wire 60. A coating of epoxy 62 is used to seal top of the fiber holder. A circuit board to be tested 63 is positioned underneath the holder 54, and the fiber 52 contacts a test pad 68a which is printed onto the circuit board substrate 70. In this particular embodiment, the circuit board consists of circuit lands 0.5 mm in width with 0.5 mm spacing between lands (pitch=1 mm). A measuring device such as an Ohmmeter 74 is connected to a current source 75 and a test pad 72 on the circuit board substrate 70. The copper wire 60 is attached to the support arm 64 of the Z-X translation stage 66 and is sufficiently strong to support the entire holder 54. The Z-X translation stage 66 includes one or more motors and a controlling device (not shown) to control the movements of the holder 54 and position the holder in desired positions to test the circuit 63.

The circuit 63 may be tested by a procedure similar to that described for FIGS. 1 and 2. The motors in the ZX translation stage move the holder 54 over a series of test pads 68a, 68b, 68c, and 68d in a continuous motion along the X axis. As the holder 54 passes over each test pad, the fiber 52 contacts each test pad, and the electrical continuity between the tested pad and pad 72 are assessed. As in the embodiment described in FIG. 1, no motion of the holder in the Z direction is necessary.

Figure 4:
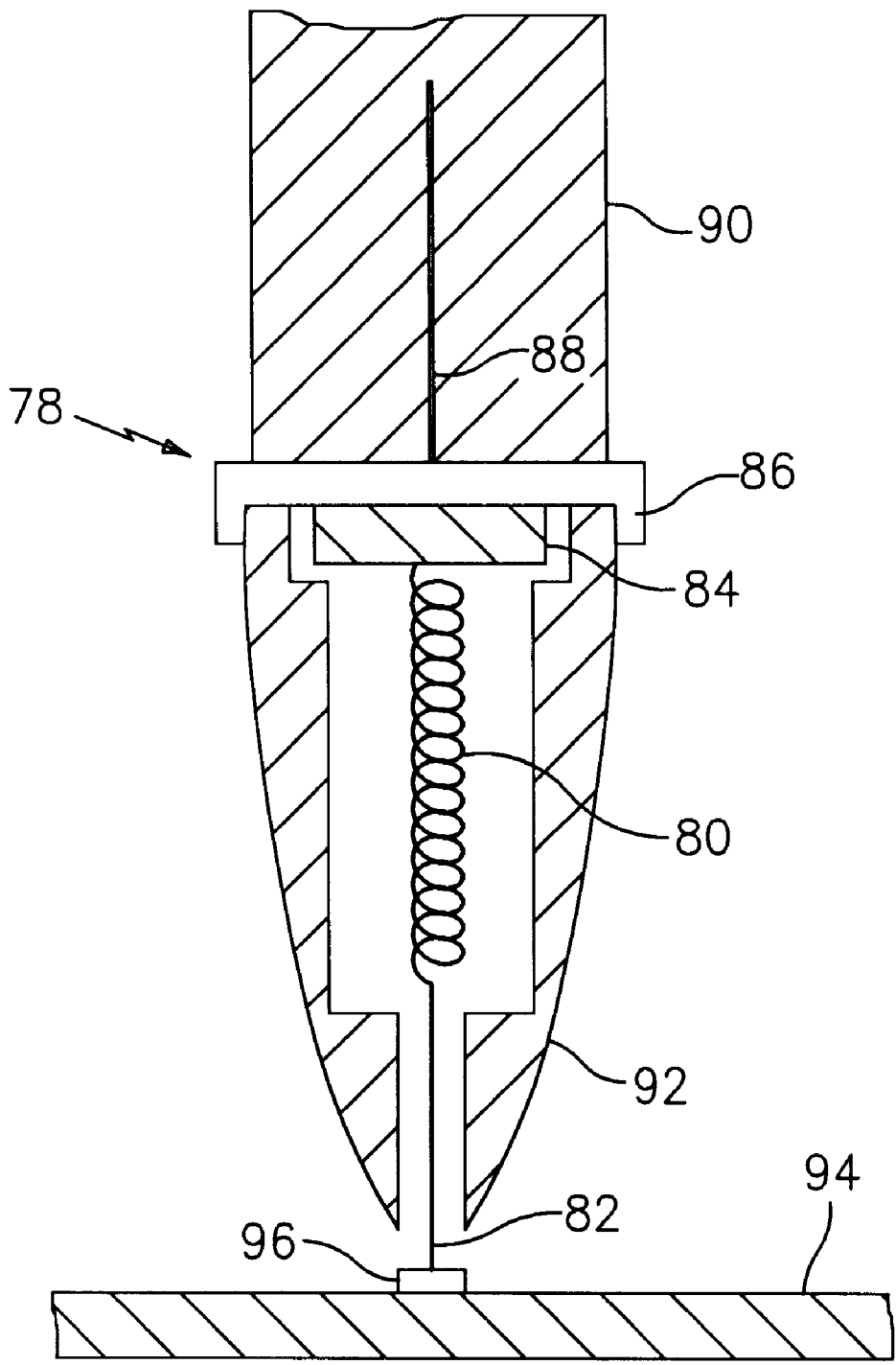
FIG. 4 is a schematic view of an alternative embodiment of the electrical contact probe of the invention.

FIG. 4 shows a schematic view of an alternative embodiment of the electrical contact probe of the invention in which a spring 80 is attached to a fiber 82 and mounted in a holder 78. The fiber 82 is preferably one or more carbon nanotubes or carbon fibers as described above, and coated with a conductive metal such as nickel, copper, tungsten, and the like. The spring is preferably made from a conductive metal such as copper or tungsten (available from D.R. Templeman Co., Plainville, Conn.). Alternatively, the spring may be made from conductive nanotubes formed into a helix and coated with a conductive metal. A metal or metal-coated spring is needed to easily attach the fiber 82 to the spring 80 by soldering.

The upper portion of the spring 80 is attached to a conducting disc 84, which is in turn connected to a conducting cap 86. A terminal wire 88 is housed within a housing 90 and connected to the conducting cap 86. The spring 80 and fiber 82 are preferably housed within an insulative tip 92 such that the spring 80 can contract and extend as needed, and to protect the fiber from damage. Preferably, the insulative tip 92 is made from "TEFLON" (fluoropolymer) or an insulative material such as nylon, acrylic, styrene, polyvinylchloride, or other suitable material.

In operation, the insulative tip 92 contacts the circuit board to be tested 94 and is moved to the appropriate location on the board. As the insulative tip 92 is moved along the surface of the board 94, the fiber 82 moves vertically and the spring 80 contracts and extends as the fiber 82 encounters surface irregularities, such as a test pad 96.

It will be appreciated by those skilled in the art that although continuity is tested in the embodiments described above, the present invention may also be used to test other electrical parameters of circuits such as resistance, capacitance, inductance, discharge time constant, impedance, and the like. Generally, these electrical parameters can be measured directly, or calculated from other values using known conversion formulae. In addition, while the embodiments of the invention are described above with respect to a continuous motion electrical contact testing apparatus, the invention is not to be limited to this type of device. The electrical contact probe of the invention is applicable with any device that tests electrical circuit or wire boards, for example, "bed of nails" (BON) testing devices or "flying probe" testing devices.

Moreover, while the above embodiments do not utilize motion in the Z (vertical) direction, such motion is possible if desired. As described above, the physical properties of the probes of the present invention allow the fibers to return to their original shape very rapidly. For example, rapid tapping or poking in the Z direction while rastering in the X-Y direction may be useful to test certain types of printed circuit or wire boards.

In another embodiment, the fiber utilized in the electrical contact probe of the invention may be directed to specific points on the circuit board by moving the fiber magnetically. The fiber utilized in this particular embodiment must be responsive to a magenetic field, and therefore carbon nanotubes filled or coated with a ferromagnetic material such as nickel, or carbon fibers coated with a ferromagnetic material are preferred. In one embodiment, a magnetic field is applied over the circuit board, with the strongest portion of the magnetic field situated at the point to be tested. The fiber filled or coated with ferromagnetic material is subjected to the applied magentic field and moves to the point to be tested (the strongest point in the magentic field).

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. An electrical contact probe, comprising at least one fiber mounted in a holder, said at least one fiber having low electrical resistance and high mechanical strength and made from a material selected from the group consisting of a conductive organic material and a conductive glass, said at least one fiber having a diameter in the range from about 5 nanometers to about 20 micrometers.

2. The electrical contact probe of claim 1, wherein said conductive organic material is selected from the group consisting of carbon nanotubes, carbon fibers, metal-coated carbon fibers, and conductive polymers.

3. The electrical contact probe of claim 2, wherein the diameter of said fiber is in the range of from about 6 nanometers to about 10 micrometers.

4. The electrical contact probe of claim 3, wherein the diameter of said fiber is in the range of from about 8 nanometers to about 8 micrometers.

5. The electrical contact probe of claim 2, wherein said electrical resistivity is in the range of from about $10^{-3}$ to about $10^5$ Ohm.meters.

6. The electrical contact probe of claim 2, wherein said mechanical strength of said fiber comprises tensile strength in the range of from about $3 \times 10^4$ to about $1.3 \times 10^8$ PSI, and a modulus of elasticity in the range of from about $3 \times 10^4$ to about $10^8$ PSI.

7. The electrical contact probe of claim 2, wherein said at least one fiber is a linear bundle of fibers.

8. The electrical contact probe of claim 1, wherein said holder comprises a housing and a conductive packing material contained in said housing, said conductive packing material in electrical communication with said at least one fiber.

9. The electrical contact probe of claim 8, wherein said conductive packing material is selected from the group consisting of graphite, copper, aluminum, silver paste, and combinations thereof.

10. The electrical contact probe of claim 2, further comprising a spring positioned between said fiber and said holder.

11. An electrical circuit test device, comprising:
  a contact probe comprising at least one fiber mounted in a holder, said at least one fiber having low electrical resistance and high mechanical strength and made from a material selected from the group consisting of a conductive organic material and a conductive glass, said fiber having a diameter in the range from about 5 nanometers to about 20 micrometers;
  a current source in electrical communication with said contact probe; and
  a measuring device in electrical communication with said contact probe.

12. The electrical circuit test device of claim 11, wherein said conductive organic material is selected from the group consisting of carbon nanotubes, carbon fibers, metal-coated carbon fibers, and conductive polymers.

13. The electrical circuit test device of claim 12, wherein the diameter of said fiber is in the range of from about 6 nanometers to about 10 micrometers.

14. The electrical circuit test device of claim 13, wherein the diameter of said fiber is in the range of from about 8 nanometers to about 8 micrometers.

15. The electrical circuit test device of claim 12, wherein said electrical resistivity is in the range of from about $10^{-3}$ to about $10^5$ Ohm.meters.

16. The electrical circuit test device of claim 12, wherein said mechanical strength of said fiber comprises tensile strength in the range of from about $3 \times 10^4$ to about $1.3 \times 10^8$ PSI, and a modulus of elasticity in the range of from about $3 \times 10^4$ to about $10^8$ PSI.

17. The electrical circuit test device of claim 12, wherein said at least one fiber is a linear bundle of fibers.

18. The electrical circuit test device of claim 12, wherein said holder comprises a housing and a conductive packing material contained in said housing, said conductive packing material in electrical communication with said at least one fiber.

19. The electrical circuit test device of claim 18, wherein said conductive packing material is selected from the group consisting of graphite, copper, aluminum, silver paste, and combinations thereof.

20. The electrical circuit test device of claim 12, wherein said electrical circuit test device is selected from the group consisting of a bed of nails test device and a flying probe test device.

21. The electrical circuit test device of claim 12, wherein said contact probe further comprises a spring positioned between said fiber and said holder.

22. An electrical circuit test device, comprising:
  a first contact probe comprising at least one first fiber mounted in a first holder, said at least one first fiber having low electrical resistivity and high mechanical strength and made from a material selected from the group consisting of a conductive organic material and a conductive glass, said fiber having a diameter in the range from about 5 nanometers to about 20 micrometers;
  a second contact probe comprising at least one second fiber mounted in a second holder, said at least one second fiber having low electrical resistivity and high mechanical strength and made from a material selected from the group consisting of a conductive organic material and a conductive glass, said fiber having a diameter in the range from about 5 nanometers to about 20 micrometers;
  a current source in electrical communication with said first contact probe and said second contact probe; and
  a measuring device in electrical communication with said current source.

23. The electrical circuit test device of claim 22, wherein said conductive organic material is selected from the group consisting of carbon nanotubes, carbon fibers, metal-coated carbon fibers, and conductive polymers.

24. The electrical circuit test device of claim 23, wherein the diameter of said first fiber or said second fiber is in the range of from about 6 nanometers to about 10 micrometers.

25. The electrical circuit test device of claim 24, wherein the diameter of said first fiber or said second fiber is in the range of from about 8 nanometers to about 8 micrometers.

26. The electrical circuit test device of claim 23, wherein said electrical resistivity is in the range of from about $10^{-3}$ to about $10^5$ Ohm.meters.

27. The electrical circuit test device of claim 23, wherein said mechanical strength of said fiber comprises tensile strength in the range of from about $3 \times 10^4$ to about $1.3 \times 10^8$ PSI, and a modulus of elasticity in the range of from about $3 \times 10^4$ to about $10^8$ PSI.

28. The electrical circuit test device of claim 23, wherein said at least one fiber is a linear bundle of fibers.

29. The electrical circuit test device of claim 22, wherein said first holder and said second holder comprise a housing and a conductive packing material contained in said housing, said conductive packing material in electrical communication with said at least one first fiber and said at least one second fiber, respectively.

30. The electrical circuit test device of claim 29, wherein said conductive packing material is selected from the group consisting of graphite, copper, aluminum, silver paste, and combinations thereof.

31. The electrical circuit test device of claim 22, wherein said electrical circuit test device is selected from the group consisting of a bed of nails test device and a flying probe test device.

32. The electrical circuit test device of claim 23, wherein said first contact probe further comprises a first spring positioned between said first fiber and said first holder, and wherein said second contact probe further comprises a second spring positioned between said second fiber and said second holder.

* * * * *